(12) United States Patent
Shaheen et al.

(10) Patent No.: US 10,065,861 B2
(45) Date of Patent: Sep. 4, 2018

(54) NIOBIUM OXYNITRIDE NANO AND MICRO-STRUCTURES

(71) Applicant: The American University in Cairo, New York, NY (US)

(72) Inventors: Basamat S. Shaheen, Cairo (EG); Nageh K. Allam, New Cairo (EG)

(73) Assignee: The American University in Cairo, New York, NY (US)

( * ) Notice: Subject to any disclaimer, the term of this patent is extended or adjusted under 35 U.S.C. 154(b) by 0 days.

(21) Appl. No.: 15/111,897

(22) PCT Filed: Jan. 16, 2015

(86) PCT No.: PCT/US2015/011747
§ 371 (c)(1),
(2) Date: Jul. 15, 2016

(87) PCT Pub. No.: WO2015/109179
PCT Pub. Date: Jul. 23, 2015

(65) Prior Publication Data
US 2016/0332878 A1    Nov. 17, 2016

Related U.S. Application Data

(60) Provisional application No. 61/928,229, filed on Jan. 16, 2014, provisional application No. 61/928,615, filed on Jan. 17, 2014.

(51) Int. Cl.
*C01B 21/082* (2006.01)
*H01L 31/00* (2006.01)
(Continued)

(52) U.S. Cl.
CPC ............ *C01B 21/0821* (2013.01); *C25B 1/00* (2013.01); *C25B 1/003* (2013.01); *C25D 5/50* (2013.01);
(Continued)

(58) Field of Classification Search
None
See application file for complete search history.

(56) References Cited

U.S. PATENT DOCUMENTS 6,075,691 A     6/2000   Duenas
7,015,527 B2    3/2006   Yang
(Continued)

FOREIGN PATENT DOCUMENTS

CA          2267439         4/1998

OTHER PUBLICATIONS

Sandu et al.; Precise Control of Multilayered Structures of Nb—O—N Films by the use of Reactive Gas Pulsing Process in DC Magnetron Sputtering; Surface& Coatings Technology; 202, 2358-2362; 2002.*

(Continued)

*Primary Examiner* — Guinever S Gregorio
(74) *Attorney, Agent, or Firm* — Lumen Patent Firm

(57) ABSTRACT

A solar energy conversion niobium oxynitride microcone and a method of the synthesis and use of niobium oxynitride microcones are provided. The material is useful for solar energy conversion, optics, photocatalysis, electrochromics, sensors and biomedical applications. According to one embodiment, Nb2O5 microcones are formed by anodization of (1M NaF and 1 wt. % HF electrolyte −40 V −20 min), they were annealed in ammonia gas to allow their doping with nitrogen. Nitridation of the micro cones shifts the absorption edge from 450 nm for the oxide form to 777 nm for the oxynitride form.

1 Claim, 21 Drawing Sheets

(51) Int. Cl.
*C25B 1/00* (2006.01)
*C25D 5/50* (2006.01)
*C25D 11/26* (2006.01)
*H01G 9/20* (2006.01)

(52) U.S. Cl.
CPC ........... C25D 11/26 (2013.01); H01G 9/2027 (2013.01); H01L 31/00 (2013.01); *C01P 2002/72* (2013.01); *C01P 2002/82* (2013.01); *C01P 2002/84* (2013.01); *C01P 2002/85* (2013.01); *C01P 2004/03* (2013.01); *C01P 2006/40* (2013.01)

(56) References Cited

U.S. PATENT DOCUMENTS

| 7,511,217 | B1 | 3/2009 | Roscheisen | |
|---|---|---|---|---|
| 2006/0258133 | A1* | 11/2006 | Georgiev | B81C 1/00111 438/610 |
| 2013/0192984 | A1 | 8/2013 | Nomura | |

OTHER PUBLICATIONS

Yang et al. Effect of electrolyte temperature on the formation of self-organized anodic niobium oxide microcones in hot phosphate-glycerol electrolyte. Appl. Surface Sc. 257(19): 8190-8195, Jul. 15, 2011.

* cited by examiner

NIOBIUM OXYNITRIDE NANO AND MICRO-STRUCTURES

CROSS-REFERENCE TO RELATED APPLICATIONS

This application is a 371 of PCT/US2015/011747 filed Jan. 16, 2015. PCT/US2015/011747 filed Jan. 16, 2015 claims the benefit of U.S. Application 61/928,229 filed on Jan. 16, 2014 and U.S. Application filed 61/928,615 filed on Jan. 17, 2014.

FIELD OF THE INVENTION

The present invention relates generally to semiconductor materials. More particularly, the invention relates to Niobium Oxynitride microcones for use in solar energy conversion, optics, photocatalysis, electrochromics, sensors and biomedical applications.

BACKGROUND OF THE INVENTION

Up till now, the studied niobium oxynitrides in literature are either thin films or powders. Additionally, current methods of fabricating niobium oxynitrides include physical (sputtering) or chemical method (sol gel). What is needed is a method of forming niobium oxynitride microcones to benefit from the decrease of the band gap caused by the N 2p energy.

SUMMARY OF THE INVENTION

The current invention relates to the synthesis and use of niobium oxynitride microcones. The material is useful for solar energy conversion, optics, photocatalysis, electrochromics, sensors and biomedical applications. According to one embodiment, $Nb_2O_5$ microcones are formed by anodization of (1M NaF and 1 wt. % HF electrolyte −40 V −20 min), they were annealed in ammonia gas to allow their doping with nitrogen. More specifically, prior to anodization, Nb foils are ultrasonically cleaned in acetone, ethanol and finally in distilled water. The anodization electrochemical cell is constructed from Platinum foil (counter electrode) and cleaned Nb foil (working electrode). Both electrodes are immersed in fluoride-containing electrolytes at room temperature (approximately 22° C.). The electrolyte is composed of 1M NaF and 1 wt. % HF electrolyte. Constant voltage (40 V) is applied between the two electrodes using Agilent E3612A DC power supply. After 20 minutes, the samples are rinsed thoroughly with acetone and distilled water and then were left to dry in air.

After the fabrication of $Nb_2O_5$ microcones, it was of great interest to study the development of the properties of this well-ordered structure in terms of band gap engineering. Niobium oxynitride microcones were developed to benefit from the decrease of the band gap caused by the N 2p energy. For the nitridation of niobium oxides to convert it into niobium oxynitrides, the as-anodized $Nb_2O_5$ samples were inserted in a quartz tube to be heated in a tube furnace at 450° C. with heating and cooling rates of 5° C./min for different time intervals. Ammonia gas was used to flow into the quartz tube during the annealing process at flow rates of 50, 200 and 300 sccm.

DETAILED DESCRIPTION

The current invention is a method of fabrication of niobium oxynitride microcones using potentiostatic anodization and thermal annealing. Some advantages of the current invention include the material has a heightened absorption in the visible region (up to λ=600 nm) that corresponds to lower band gap. Further, the material has a novel architecture comprising larger surface area and stability compared to the other nanostructured forms (pores and channels). In another aspect of the invention, the synthesis method is optimized to obtain oxynitride materials with different nitrogen to oxygen ratios.

The current invention combines a uniform cone structure with the enhanced properties of oxynitride materials, where niobium oxynitride microcones have better optical properties and chemical stability.

Figure 1:
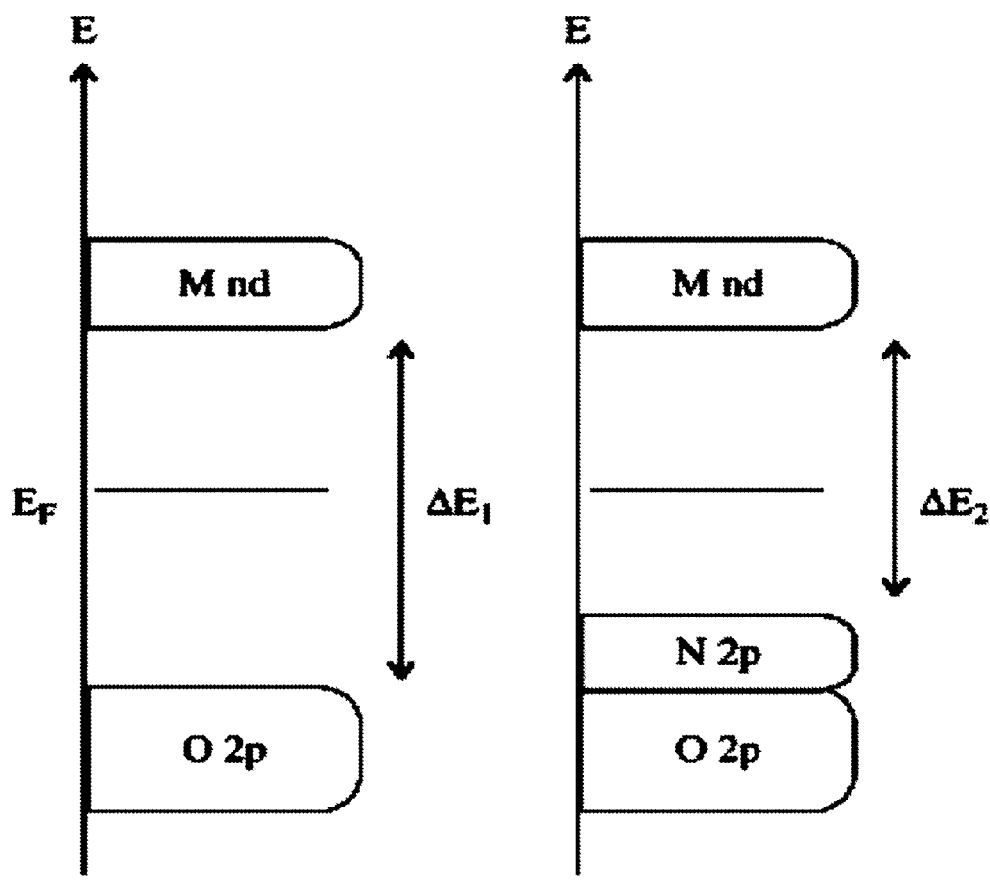
FIG. 1 shows a schematic drawing of the band structure in metal oxides (left) and metal oxynitrides (right), according to one embodiment of the current invention.

Ordinary niobium oxides are wide bandgap semiconductor materials limiting their light activity to the ultraviolet region of the light spectrum, which constitutes only 3% of the solar light. According to the niobium oxynitride of the current invention, the band gap is decreased to allow the absorption in the visible light, which accounts for 40% of the light spectrum. The narrow bandgap is a result of the hybridization between the O 2p and N 2p orbitals (see FIG. 1).

Figure 2A:
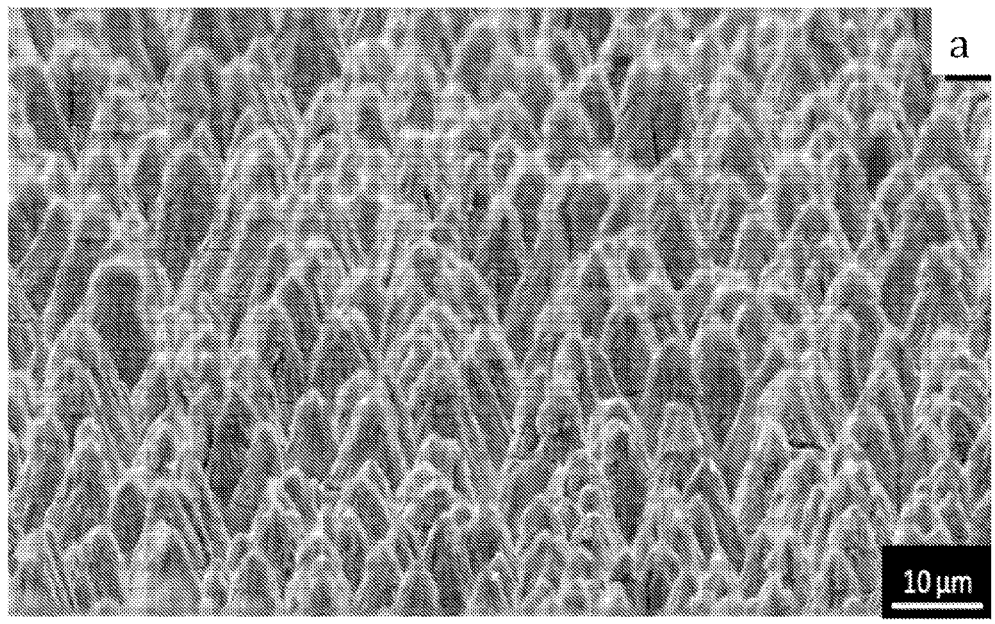
FIGS. 2A-2B show field emission—scanning electron microscope images for the niobium oxide microcones structure (2A) as fabricated by anodization and (2B) after nitridation by annealing in ammonia gas, according to embodiments of the current invention.
Figure 2B:
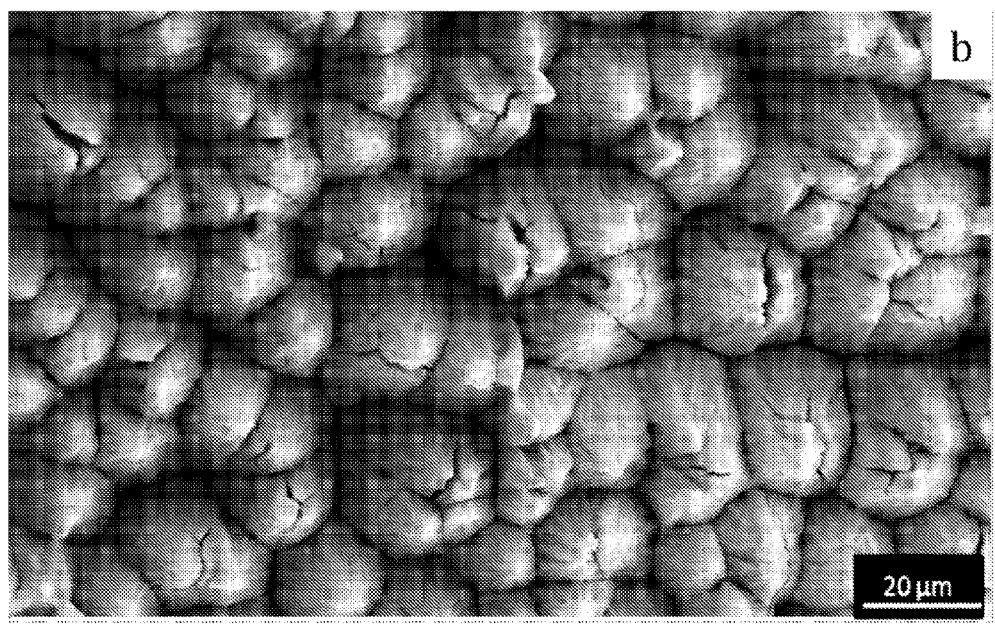

The current invention provides fabricated niobium oxynitride in a highly ordered and uniform structure as shown in FIGS. 2A-2B. Until now, in films or powders, the light management and the charge carrier dynamics are not controlled. The microcones structure is considered very stable and can be synthesized on large scale.

According to one embodiment of the invention, the niobium oxynitride cones are useful for electrochromic applications such as smart windows and screens, in addition to sensors and capacitors. The invention comprises biocompatibility properties that are useful in biological/biomedical applications.

Figure 3A:
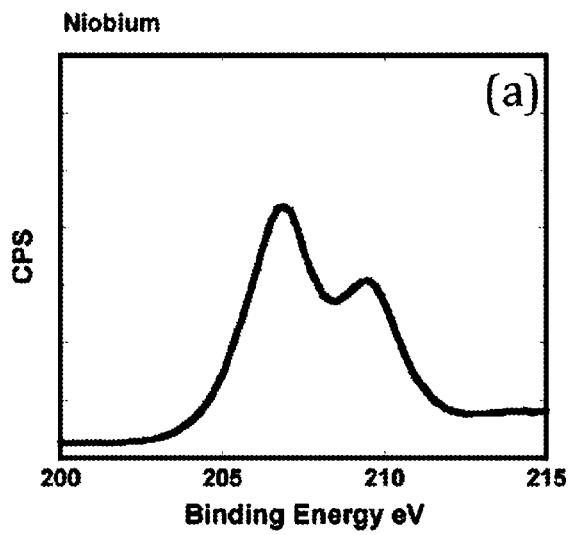
FIGS. 3A-3C show XPS Survey result for sample niobium oxynitride microcones, according to the current invention.
Figure 3B:
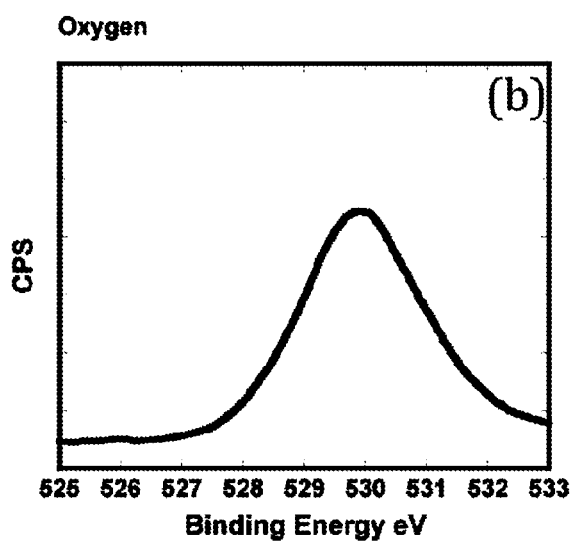
Figure 3C:
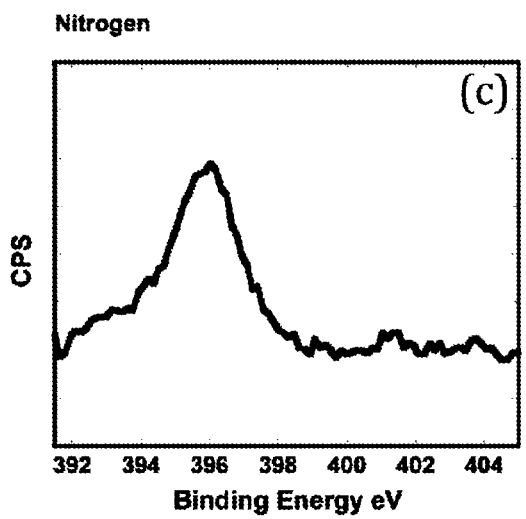
Figure 4:
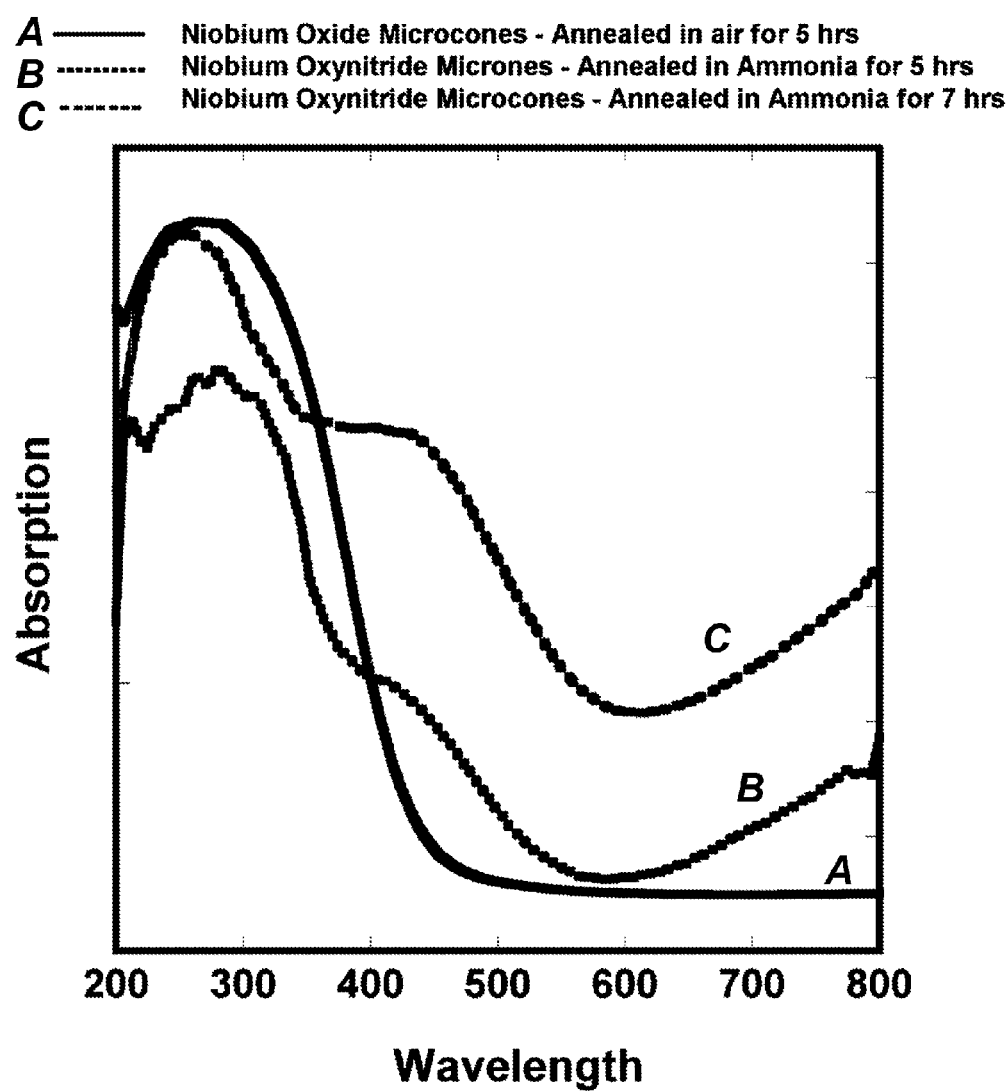
FIG. 4 shows absorption of niobium oxide microcones compared to two samples of niobium oxynitride microcones, according to the current invention.

In on example, niobium oxynitride material was synthesized and characterized in the laboratory to ensure the formation of oxynitride, and to test the optical properties. FIGS. 3A-3C show x-ray photoelectron scans showing the binding energies versus intensity counts per second (CPS) of sample niobium oxynitride microcones, according to the current invention. FIG. 4 shows absorption of niobium oxide microcones compared to two samples of niobium oxynitride microcones, according to the current invention. The samples were also tested as photoanodes for hydrogen production from water splitting.

Prior to anodization, Nb foils were ultrasonically cleaned in acetone, ethanol and finally in distilled water. The anodization electrochemical cell was constructed from platinum foil (counter electrode) and cleaned Nb foil (working electrode). Both electrodes were immersed in fluoride-containing electrolytes at room temperature (approximately 22° C.). The electrolyte was composed of 1M NaF and 1 wt. % HF electrolyte. Constant voltage (40 V) was applied between the two electrodes using Agilent E3612A DC power supply. After 20 minutes, the samples were rinsed thoroughly with acetone and distilled water and then were left to dry in air.

Thermal annealing was done after the fabrication of $Nb_2O_5$ microcones. The development of niobium oxynitride microcones to make benefit from the decrease of the band gap caused by the N 2p energy is provided. Up till now, the studied niobium oxynitrides in literature are either thin films or powders. For the nitridation of niobium oxides to convert it into niobium oxynitrides, the as-anodized $Nb_2O_5$ samples were inserted in a quartz tube to be heated in a tube furnace at 450° C. with heating and cooling rates of 5° C./min for different time intervals. Ammonia gas was used to flow into the quartz tube during the annealing process at flow rates of 50, 200 and 300 sccm. The parameters investigated for the ammonia annealing are shown in Table 1.

TABLE 1

Conditions of annealing Nb2O5 microcones in ammonia.

| Sample Code | Ammonia Flow Rate (sccm) | Annealing Duration (min) | Annealing Temperature (° C.) |
|---|---|---|---|
| S1 | 50 | 20 | 440 |
| S2 | 150 | 180 | 450 |
| S3 | 200 | 20 | 440 |
| S4 | 300 | 20 | 450 |
| S5 | 300 | 60 | 450 |
| S6 | 200 | 300 | 450 |
| S7 | 200 | 420 | 450 |

Oxide samples S8, S9 and S10 annealed in air, as shown in Table 2, were tested for comparison.

TABLE 2

Conditions of fabricating Nb2O5 samples.

| Sample Code | Fabrication Procedure |
|---|---|
| S8 | Anodized Microcones-Air Annealing (450° C.-20 minutes) |
| S9 | Anodized Microcones-Air Annealing (450° C.-300 minutes) |
| S10 | Thermally oxidized by annealing in air (450° C.-300 minutes) |

Anodized Microcones—Air Annealing (450° C.-300 minutes) S10 Thermally oxidized by annealing in air (450° C.-300 minutes)

Figure 5A:
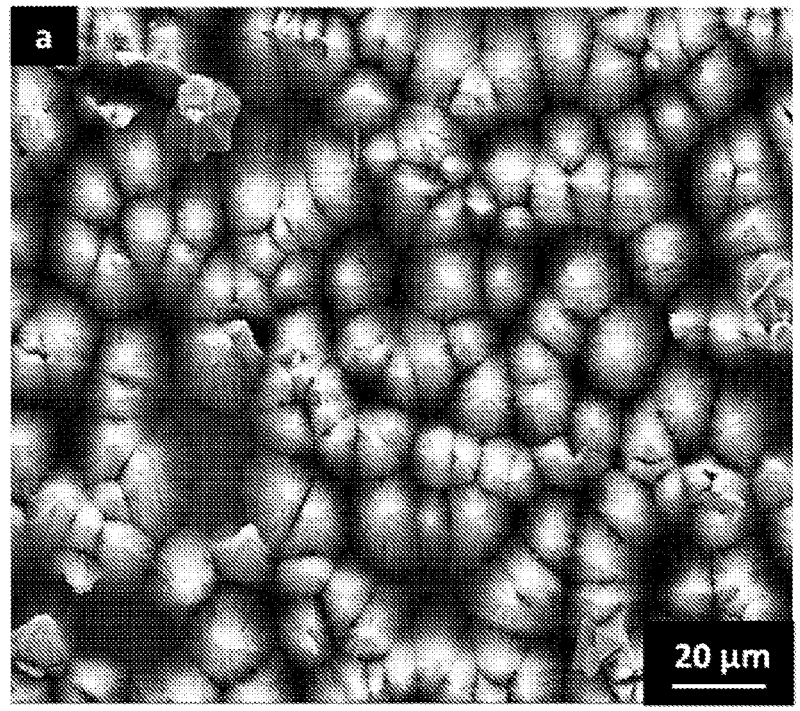
FIGS. 5A-5B show FESEM top-view images of (A) as-anodized $Nb_2O_5$ micro cones, and (B) the Nb—O—N micro cones formed via annealing in ammonia atmosphere for 7 hours, according to the current invention.
Figure 5B:
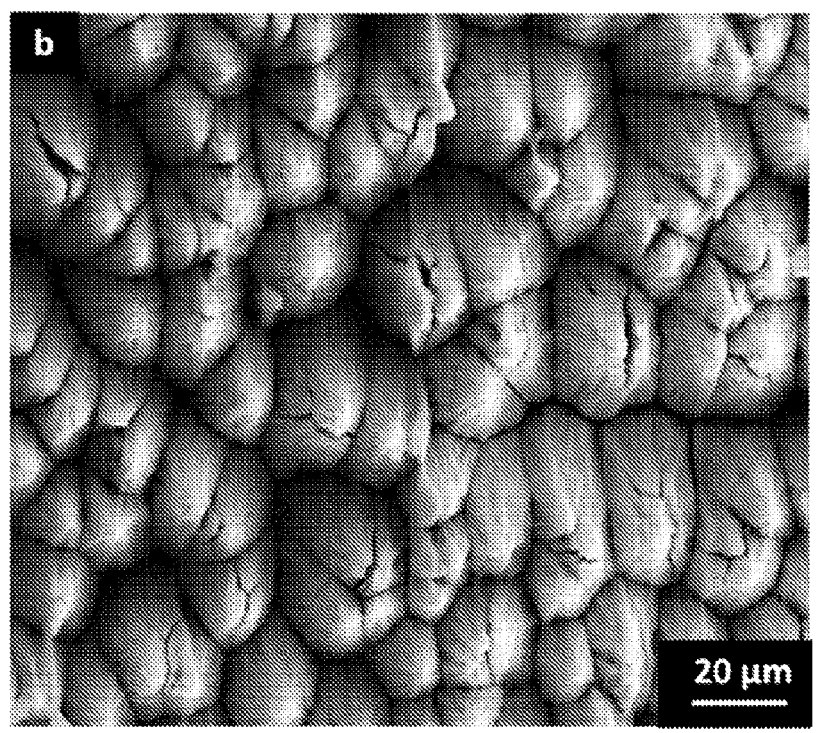

Turning now to morphological and structural characterization, FIGS. 5A-5B show the FESEM images of the Nb—O—N microcones. It can be observed that the microcones preserved their morphology after the $NH_3$ annealing compared to as-anodized oxide sample. However, $Nb_2O_5$ some deformation appears and it is thought to be because of the long duration of annealing.

Table 3 shows the concentrations of the major elements Nb, O, N and also the concentrations of carbon and fluorine in samples annealed in NH3 compared to oxide samples S8, S9 and S10 as found by X-ray photoelectron spectroscope (XPS). The annealing temperature was almost constant (440-450 OC) so that the ammonia flow rate and the annealing duration were the main parameters to convert oxides into oxynitrides 450 0C).

TABLE 3

The atomic concentrations and the positions of peaks of the main elements (Nb, N, O, C and F) obtained from XPS survey analysis.

| | Element | | | | | | | | | |
|---|---|---|---|---|---|---|---|---|---|---|
| | Nb 3d | | N 1s | | O 1s | | C 1s | | F 1s | |
| Sample | At. % | Position | At. % | Position | At. % | Position | At. % | Position | At. % | Position |
| S1 | 23.2 | 210 | 0.31 | 396 | 67 | 531 | 6 | 286 | 3.3 | 685 |
| S2 | 24.2 | 208 | 2.51 | 397 | 65.2 | 531 | 6.9 | 285 | 1.2 | 685 |
| S5 | 29 | 210 | 0.9 | 394 | 64.7 | 531 | 5.5 | 285 | 0 | — |
| S6 | 28.6 | 206 | 3 | 394 | 60 | 529 | 7.3 | 283 | 1.2 | 682 |
| S7 | 28 | 206 | 5.7 | 395 | 64.2 | 529 | 1.3 | 283 | 0.8 | 683 |
| S8 | 31.64 | 207 | 0.83 | 401 | 65.5 | 530 | 2 | 285 | 0 | — |
| S9 | 16.9 | 207 | 0 | — | 73 | 530 | 10.2 | 284 | 0 | — |
| S10 | 17.53 | 207 | 0 | — | 75 | 530 | 7.5 | 285 | 0 | — |

Figure 6A:
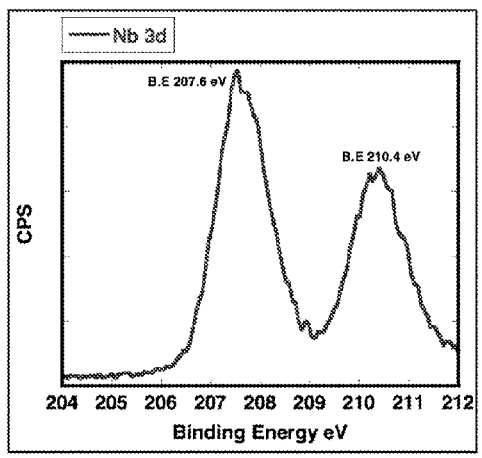
FIGS. 6A-6C show XPS Spectra of Nb 3d, O 1s and N 1s in microcones S1 annealed in $NH_3$ with flow rate 50 sccm at 440° C. for 20 min, according to the current invention.
Figure 6B:
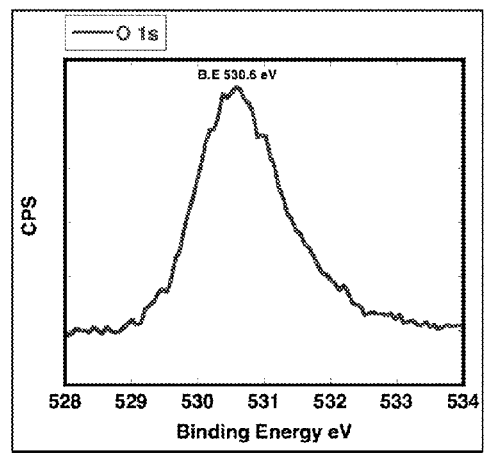
Figure 6C:
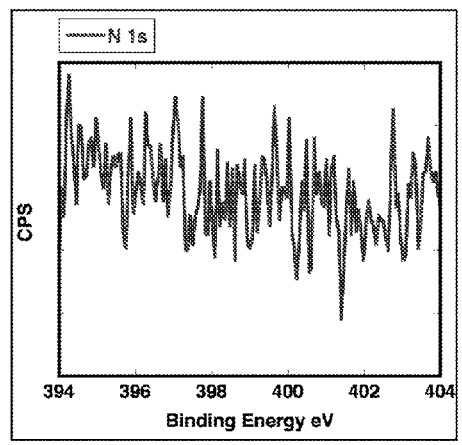
Figure 7A:
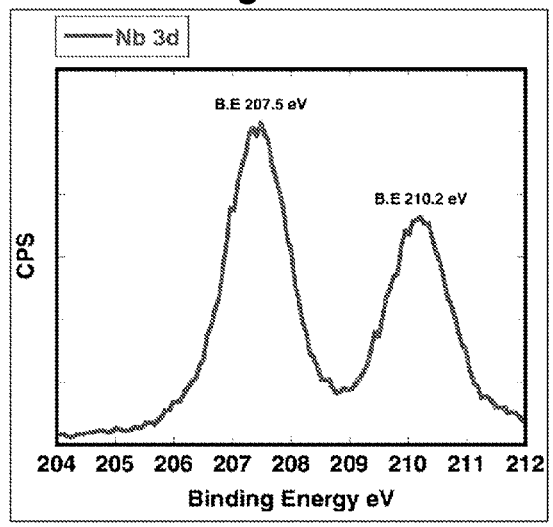
FIGS. 7A-7C show XPS Spectra of Nb 3d, O 1s and N 1s in microcones S2 annealed in $NH_3$ with flow rate 150 sccm at 450° C. for 180 min, according to the current invention.
Figure 7B:
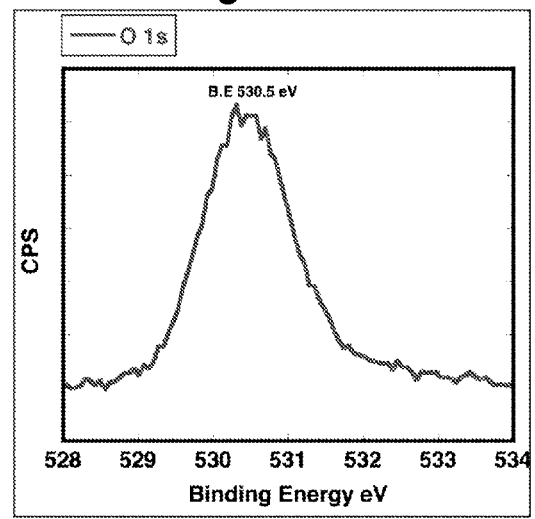
Figure 7C:
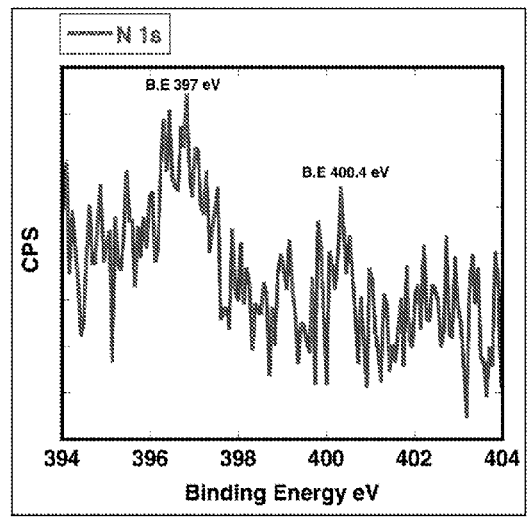
Figure 8A:
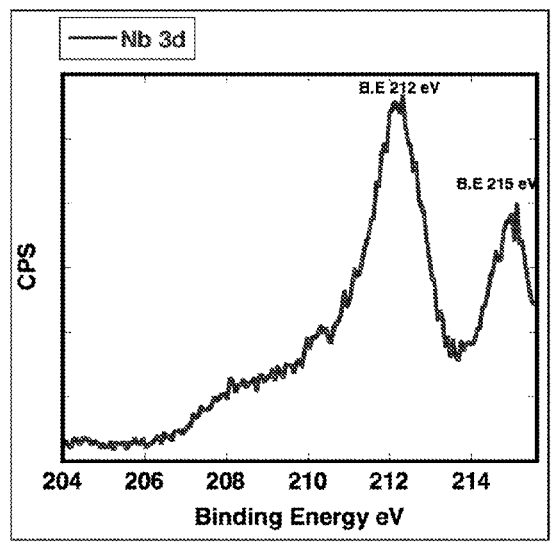
FIGS. 8A-8C XPS Spectra of Nb 3d, O 1s and N 1s in microcones S3 annealed in $NH_3$ with flow rate 200 sccm at 440° C. for 20 min, according to the current invention.
Figure 8B:
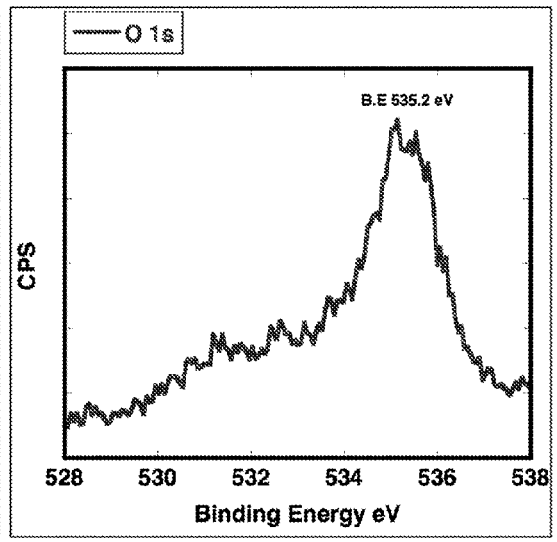
Figure 8C:
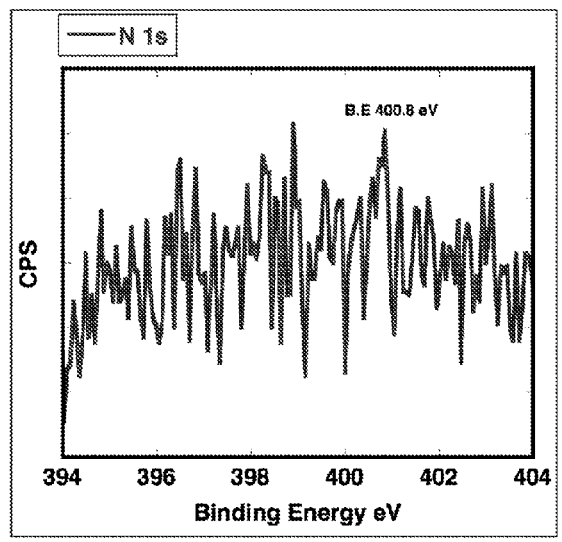
Figure 9A:
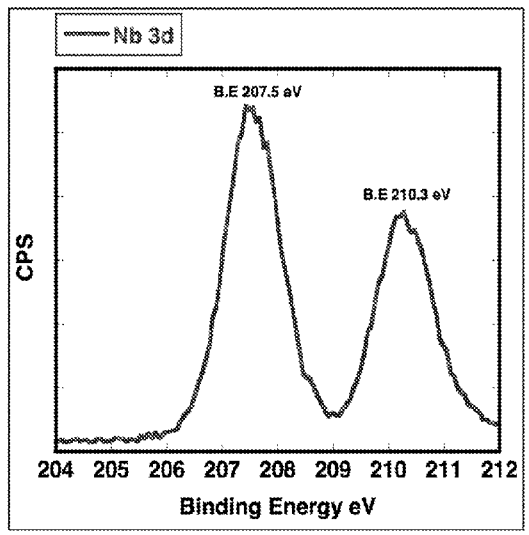
FIGS. 9A-9C show XPS Spectra of Nb 3d, O 1s and N 1s in microcones S4 annealed in $NH_3$ with flow rate 300 sccm at 450° C. for 20 min, according to the current invention.
Figure 9B:
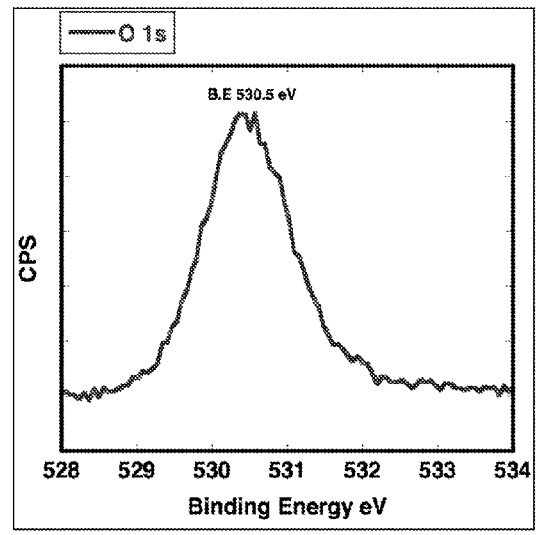
Figure 9C:
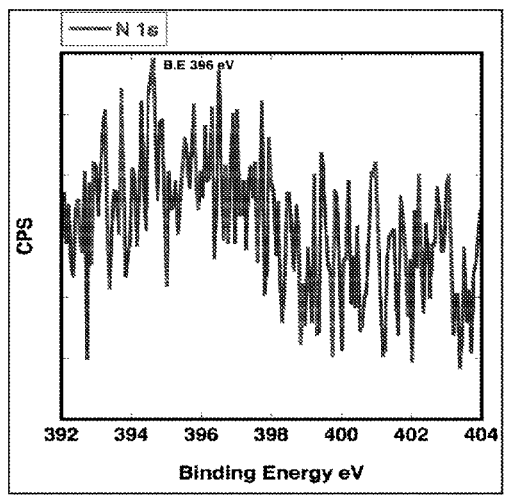
Figure 10A:
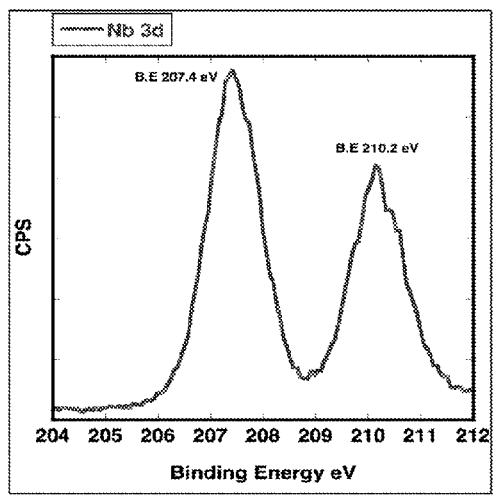
FIGS. 10A-10C show XPS Spectra of Nb 3d, O 1s and N 1s in microcones S5 annealed in $NH_3$ with flow rate 300 sccm at 450° C. for 60 min, according to the current invention.
Figure 10B:
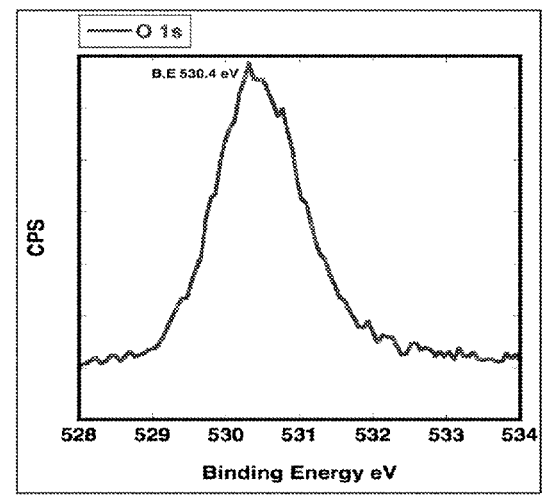
Figure 10C:
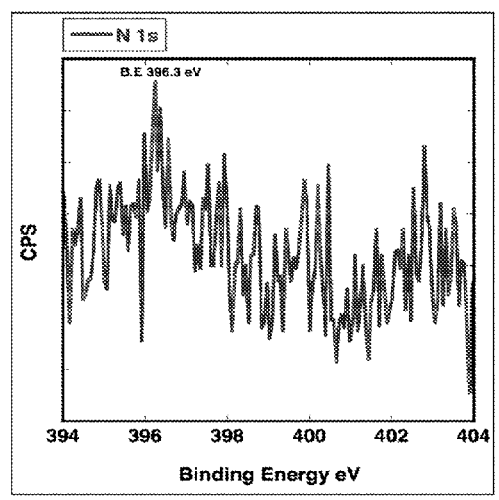
Figure 11A:
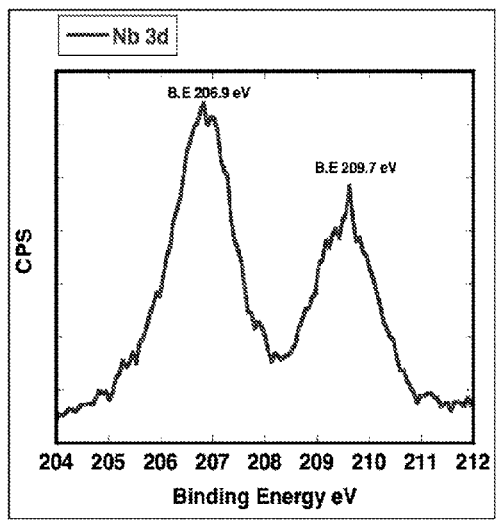
FIGS. 11A-11C show XPS Spectra of Nb 3d, O 1s and N 1s in microcones S6 annealed in $NH_3$ with flow rate 200 sccm at 450° C. for 300 min, according to the current invention.
Figure 11B:
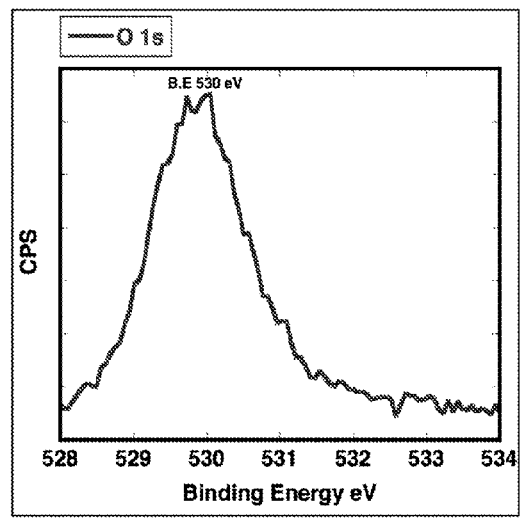
Figure 11C:
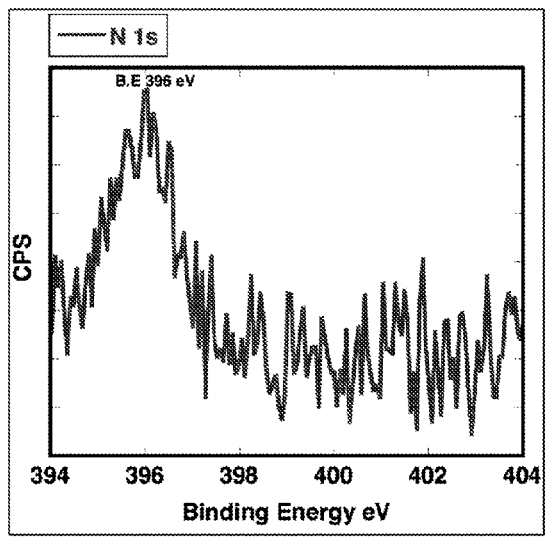
Figure 12A:
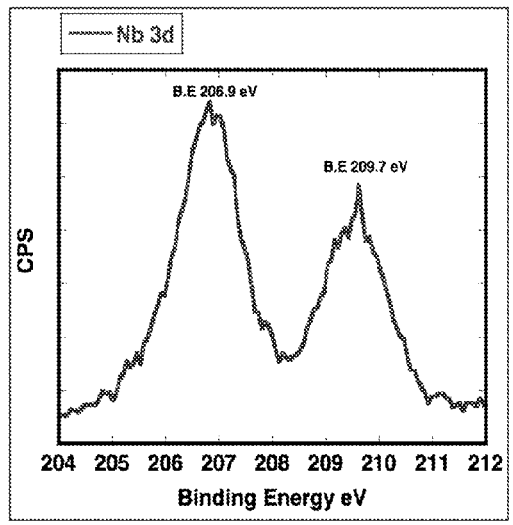
FIGS. 12A-12C show XPS Spectra of Nb 3d, O 1s and N 1s in microcones S7 annealed in $NH_3$ with flow rate 200 sccm at 450° C. for 480 min, according to the current invention.
Figure 12B:
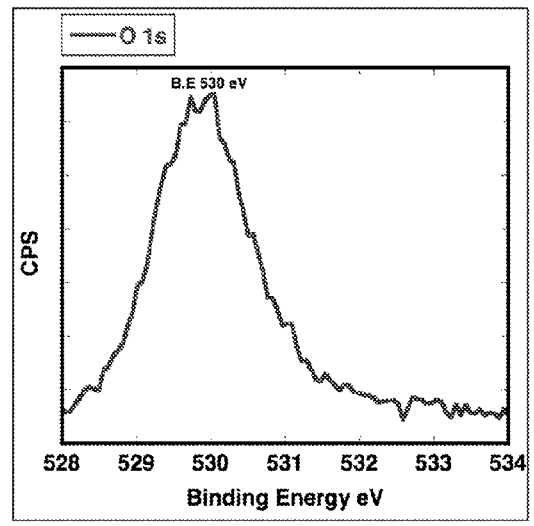
Figure 12C:
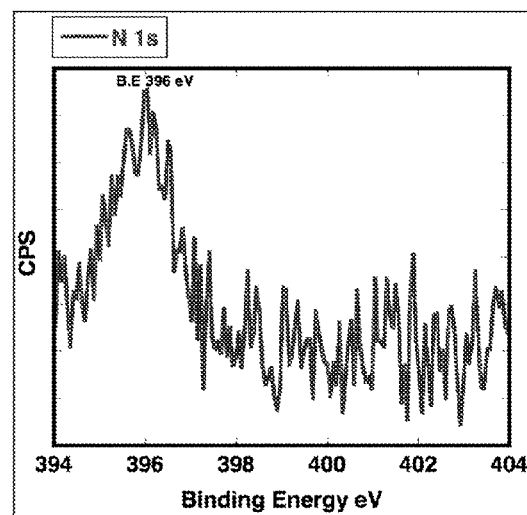
Figure 13A:
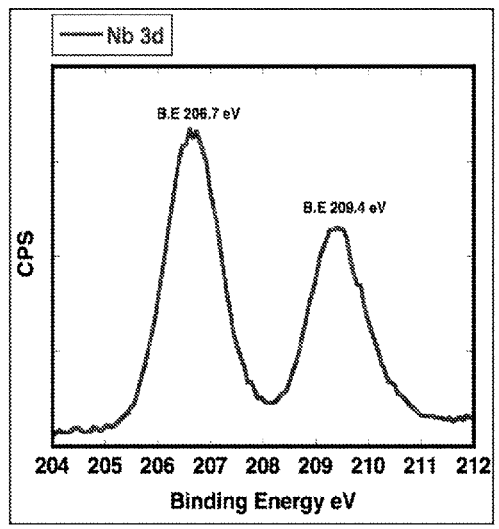
FIGS. 13A-13B show XPS Spectra of Nb 3d and O 1s in microcones S8 annealed in air at 440° C. for 20 min, according to the current invention.
Figure 13B:
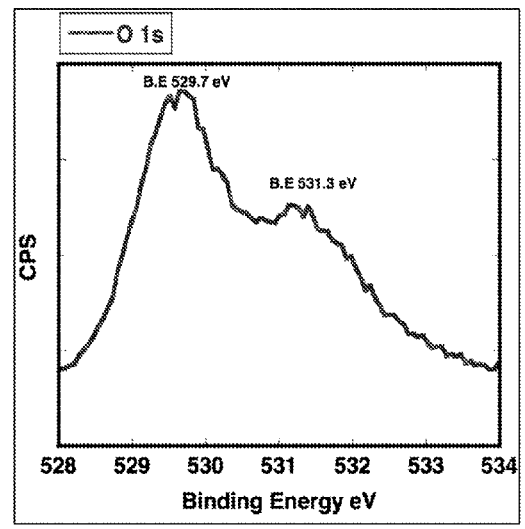
Figure 14A:
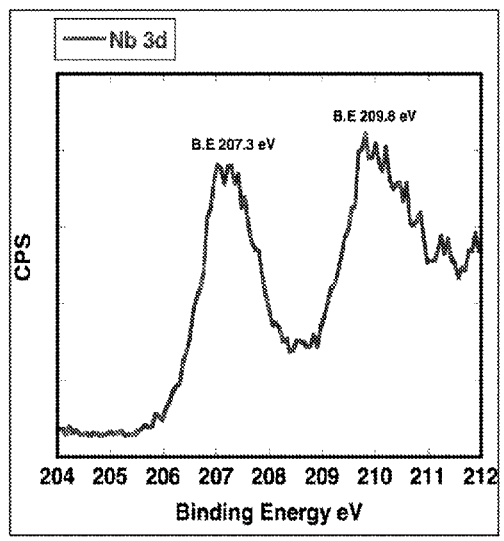
FIGS. 14A-14B show XPS Spectra of Nb 3d and O 1s in microcones S9 annealed in air at 440° C. for 300 min, according to the current invention.
Figure 14B:
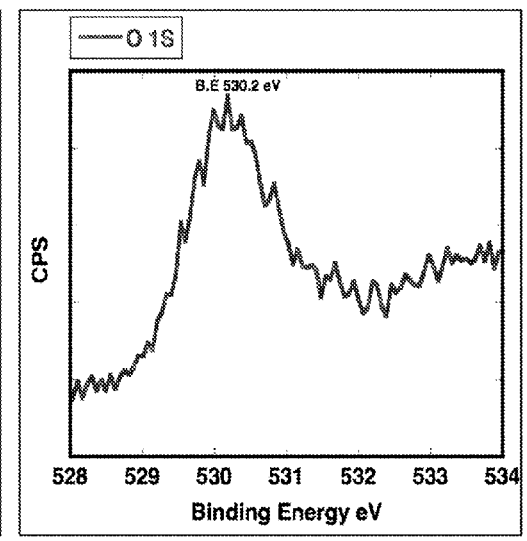
Figure 15A:
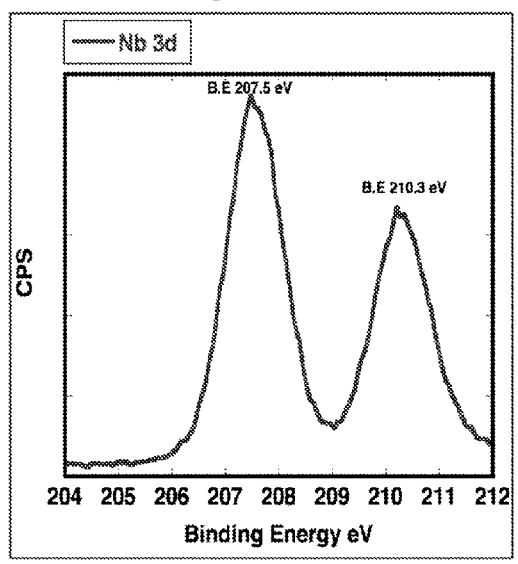
FIGS. 15A-15B show XPS Spectra of Nb 3d and 0 is in thermal oxide film S10 annealed in air at 450° C. for 300 min, according to the current invention.
Figure 15B:
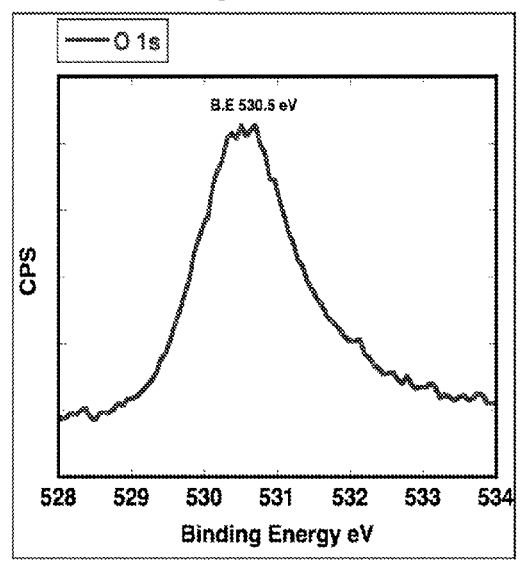

The investigation of oxynitrides by XPS is essential to prove the formation of oxynitrides through nitrogen doping rather than the surface adsorption of nitrogen. Adsorbed nitrogen has binding energy of ≈399 eV. However, oxynitride materials show nitrogen peaks of less binding energy due to N=O bonds. FIGS. 6A-6C show the XPS spectra of sample S1. No peak for nitrogen was observed in the N is spectrum indicating that annealing in flow rate 50 sccm for 20 minutes is not sufficient to allow nitrogen doping. However, N peak appeared at binding energy of 397 eV in the sample S2 by increasing the flow rate to 150 sccm and the duration to 3 hours as shown in FIGS. 7A-7C. This peak can be related to the N—O bond, while the nitrogen peak observed at 400 eV can be related to adsorbed nitrogen. At a flow rate of 200 sccm and annealing duration of 20 minutes, sample S3 did not show a significant peak for nitrogen as shown in FIGS. 8A-8C. Increasing the flow rate to 300 sccm at the same annealing duration did not lead to the formation of a significant N peak as shown in FIGS. 9A-9C. On the other hand, N peak with a binding energy of 396 eV was found by increasing the annealing duration to 1 hour at a flow rate of 300 sccm as shown in FIGS. 10A-10C. High annealing duration was found to be efficient at a flow rate of 200 sccm to produce high nitrogen doping. This was concluded from the significant N peaks found at 396 and 395 eV for durations 5 and 7 hours as shown in FIGS. 11A-11C and FIGS. 12A-12C, respectively. Spectra of Nb 3d and 0 is are analyzed for oxide samples S8, S9 and S10 as shown in FIGS. 13A-13B, FIGS. 14A-14B and FIGS. 15A-15B, respectively. It can be observed from Table 3 that the peaks of C is found in the samples were located in a range of binding energies (283-286 eV) that can be attributed to adventitious carbon from handling.

Figure 16:
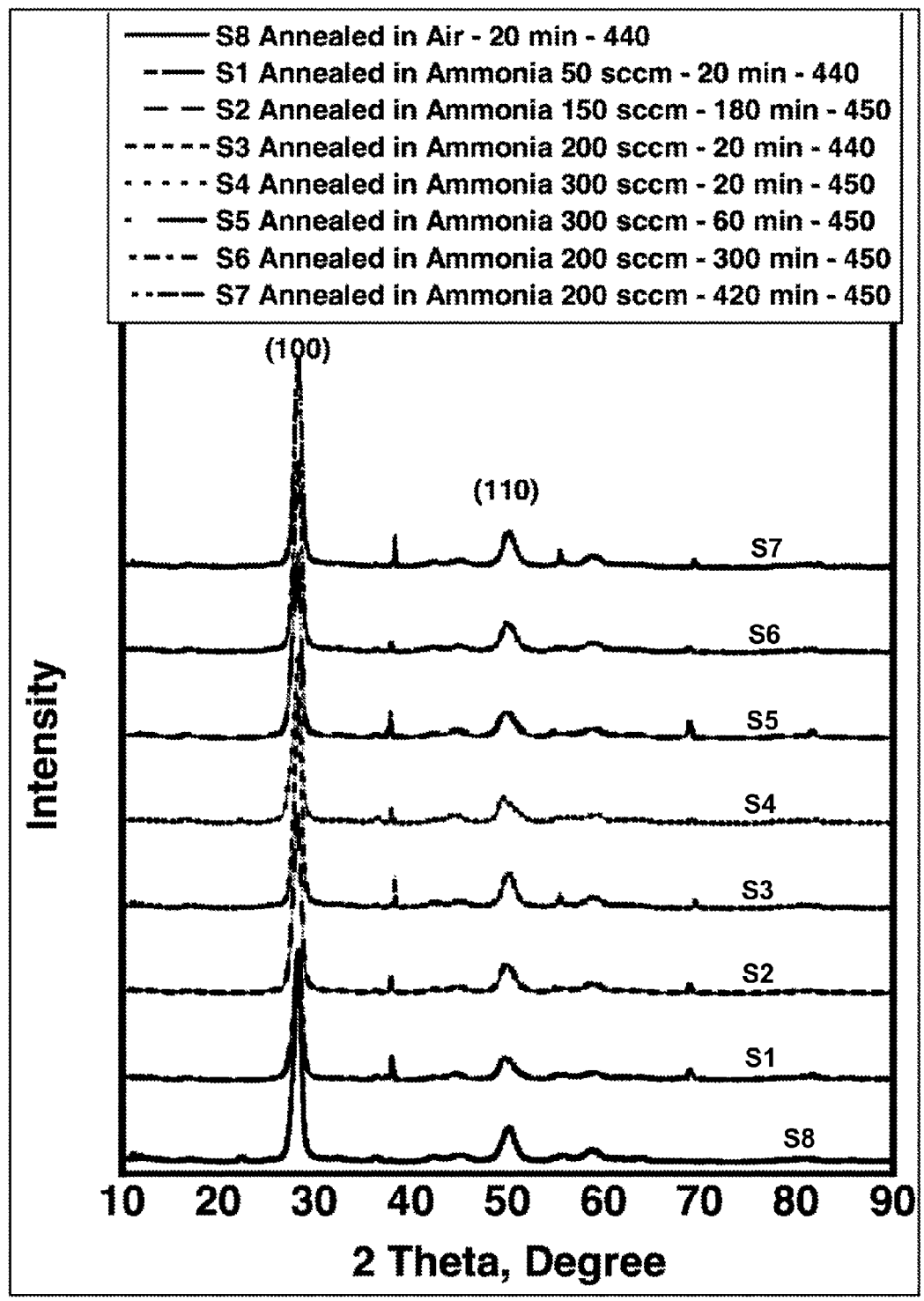
FIG. 16 shows GAXRD diffraction patterns of microcones annealed in ammonia (S1, S2, S3, S4, S5, S6, and S7) compared to Nb2O5 microcones annealed in air for 20 min at 450° C. (S8), according to the current invention.

The XRD patterns of the oxynitride samples (S1 to S7) are shown in FIG. 16, and compared to one oxide sample (S8). No significant difference in the peaks can be observed between the oxynitrides and the oxide sample. On the other hand, peaks appearing at 27° and 50° are attributed to (100) and (110) planes of orthorhombic $Nb_2O_5$.

Figure 17:
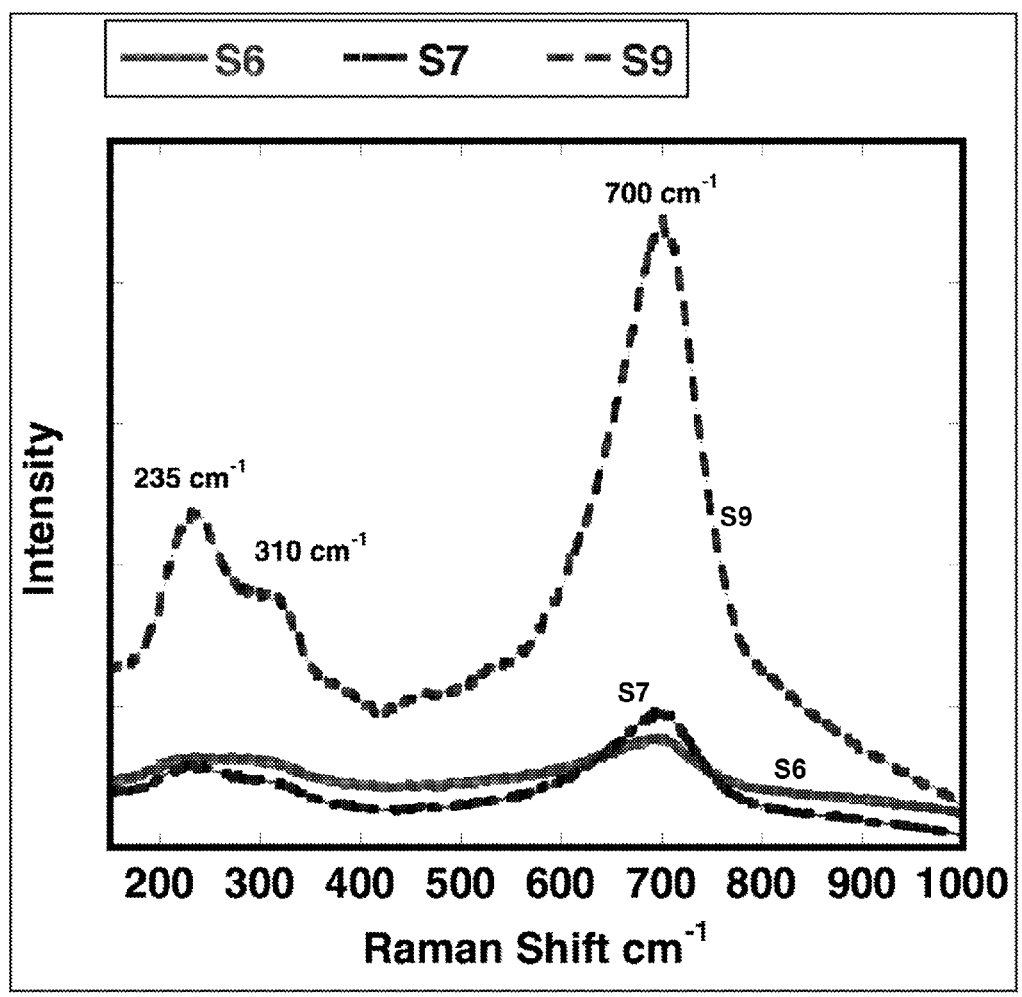
FIG. 17 shows that Raman spectra of microcones annealed in ammonia (S6 and S7) compared to $Nb_2O_5$ microcones annealed in air for 5 hours at 450° C. (S9), according to the current invention.

For more structural analysis, Raman spectroscopy for oxynitride samples (S6 and S7) is compared to that of oxide sample (S9). FIG. 17 shows that the oxide sample (S9) has more prominent peaks than the oxynitride samples (S6 and S7). The band at 235 $cm^{-1}$ is characteristic for $Nb_2O_5$. The peaks at 700 and 310 $cm^{-1}$ can be indicative of the orthorhombic crystal structure of $Nb_2O_5$, which is in agreement with the XRD results.

Figure 18:
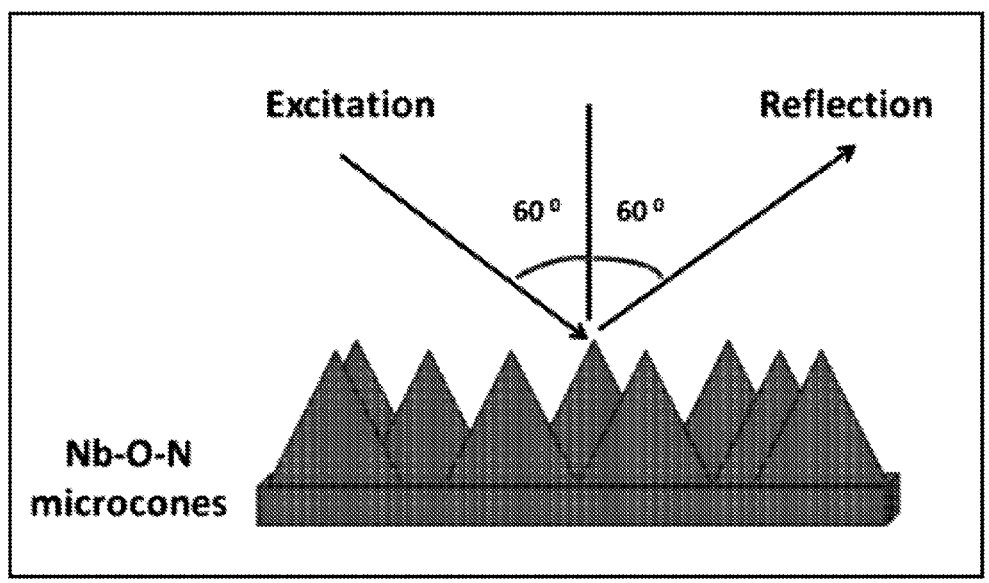
FIG. 18 shows an illustration of the reflection measurements of microcones at different angles, according to the current invention.
Figure 19A:
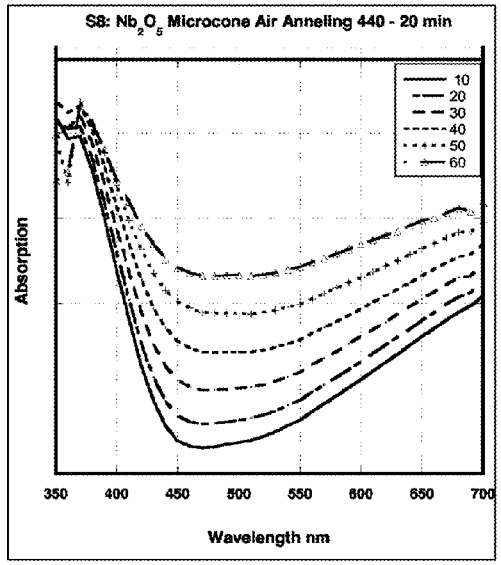
FIGS. 19A-19D show the absorption spectra at different incident angles of niobium oxide microcones (S8), and samples annealed in ammonia (S1, S2, and S3), according to the current invention.
Figure 19B:
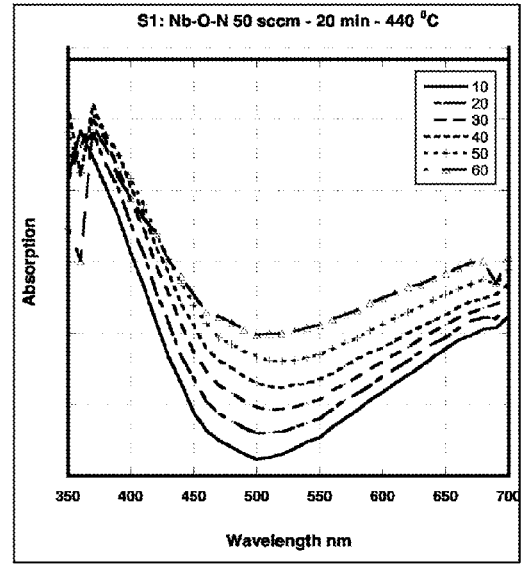
Figure 19C:
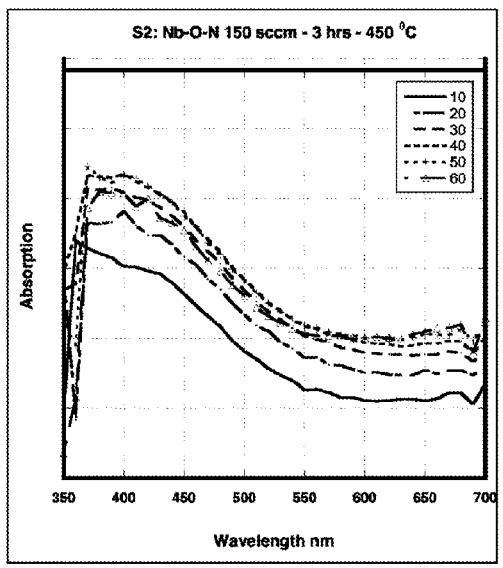
Figure 19D:
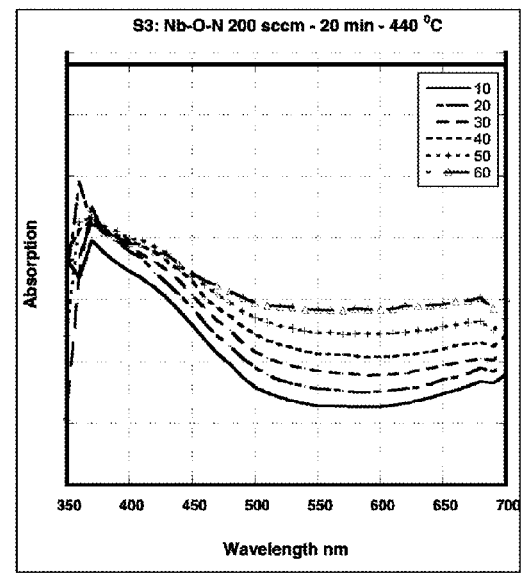
Figure 20A:
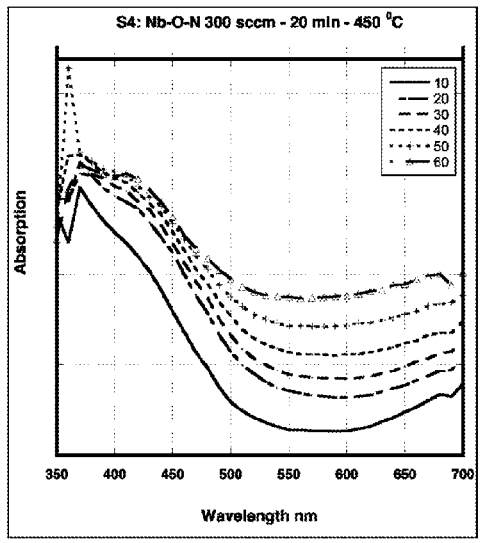
FIGS. 20A-20D show the absorption spectra at different incident angles of samples annealed in ammonia (S4, S5, S6 and S7), according to the current invention.
Figure 20B:
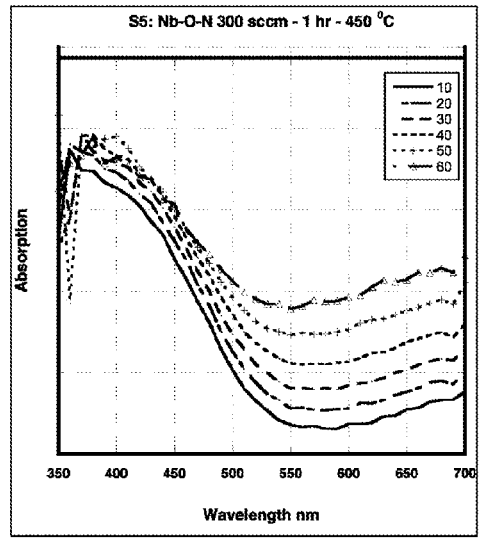
Figure 20C:
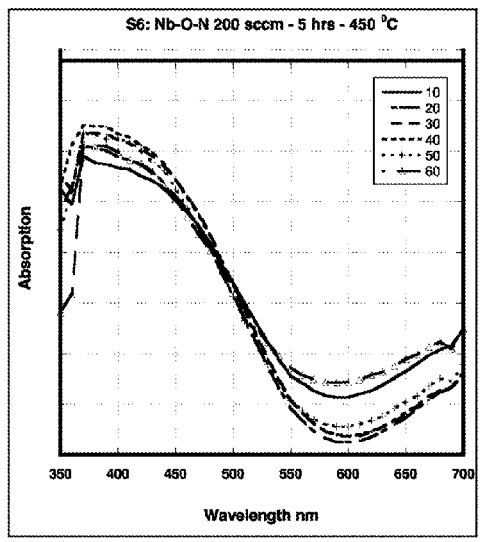
Figure 20D:
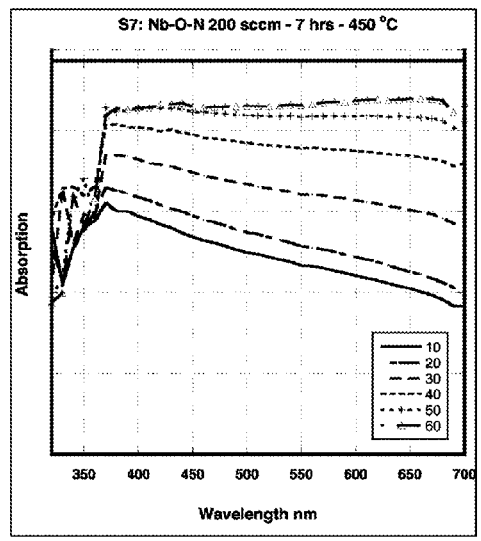

Turning now to optical characterization, as explained before, the optical properties are one factor to determine the performance of photoelectrodes. Since it was confirmed by the XPS that nitrogen doping was done at some conditions, it is expected to find differences in the optical properties. Therefore, the UV-Vis absorption of samples annealed in ammonia was measured and compared with niobium oxide sample (S8) at different incident angles from 10 to 60 degrees. Illustration for the reflection measurements at different angles is shown in FIG. 18. It was observed in all samples (S1-S8) that the highest red shift is obtained at incident angle of 600 as shown in FIGS. 19A-19D and FIGS. 20A-20D.

Figure 21:
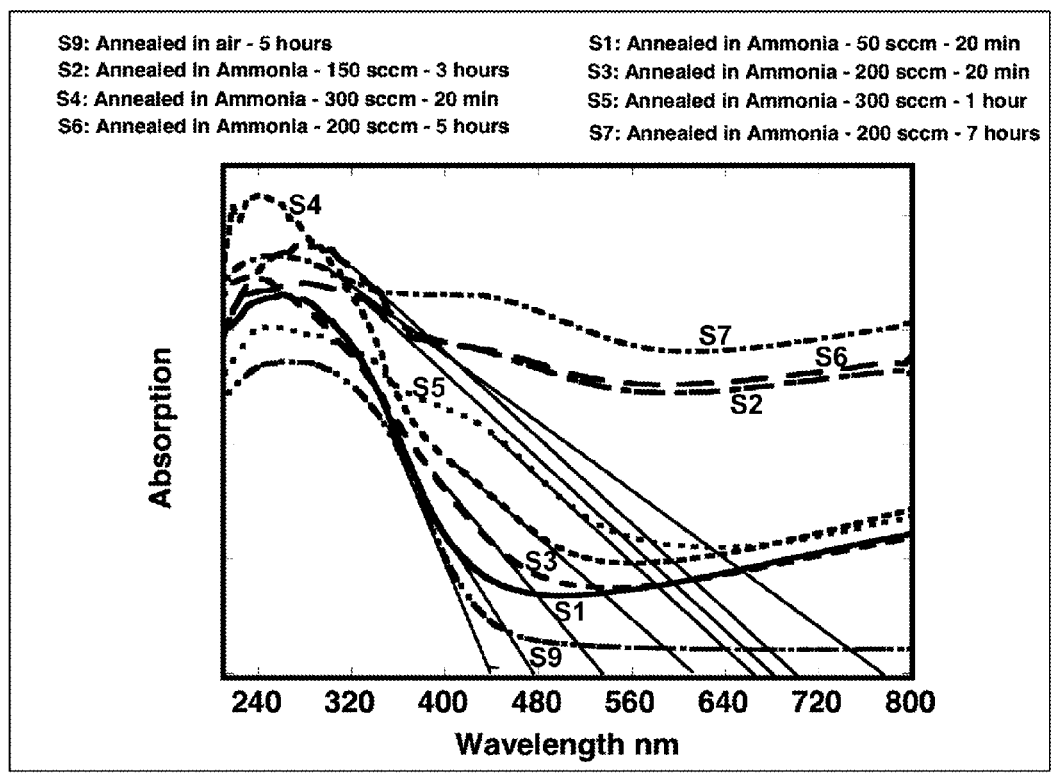
FIG. 21 shows the absorption spectra of niobium microcones annealed in ammonia at different conditions (S1, S2, S3, S4, S5, S6, and S7) compared to that annealed in air for 5 hours (S9), according to the current invention.

In addition, the red shift increases with the increase in the amount of nitrogen doping. The absorption spectra of all the samples are drawn together in FIG. 21 for better comparison. This absorption increase can be related to the decrease in the bandgap upon the increase in the amount of nitrogen doped in the material. Table 4 summarizes the maximum absorption and the corresponding optical bandgap determined from the equation:

$$E = \frac{1240}{\lambda},$$

where E is the bandgap energy and λ is the wavelength in nm.

TABLE 4

The maximum absorption and optical bandgap of niobium oxynitride microcones compared with niobium oxide.

| Sample | Maximum Wavelength, nm | Optical Bandgap, eV |
|---|---|---|
| S9 | 440 | 2.8 |
| S1 | 478 | 2.6 |
| S2 | 700 | 1.77 |
| S3 | 534 | 2.32 |
| S4 | 615 | 2.01 |
| S5 | 665 | 1.86 |
| S6 | 683 | 1.82 |
| S7 | 777 | 1.56 |

Figure 22:
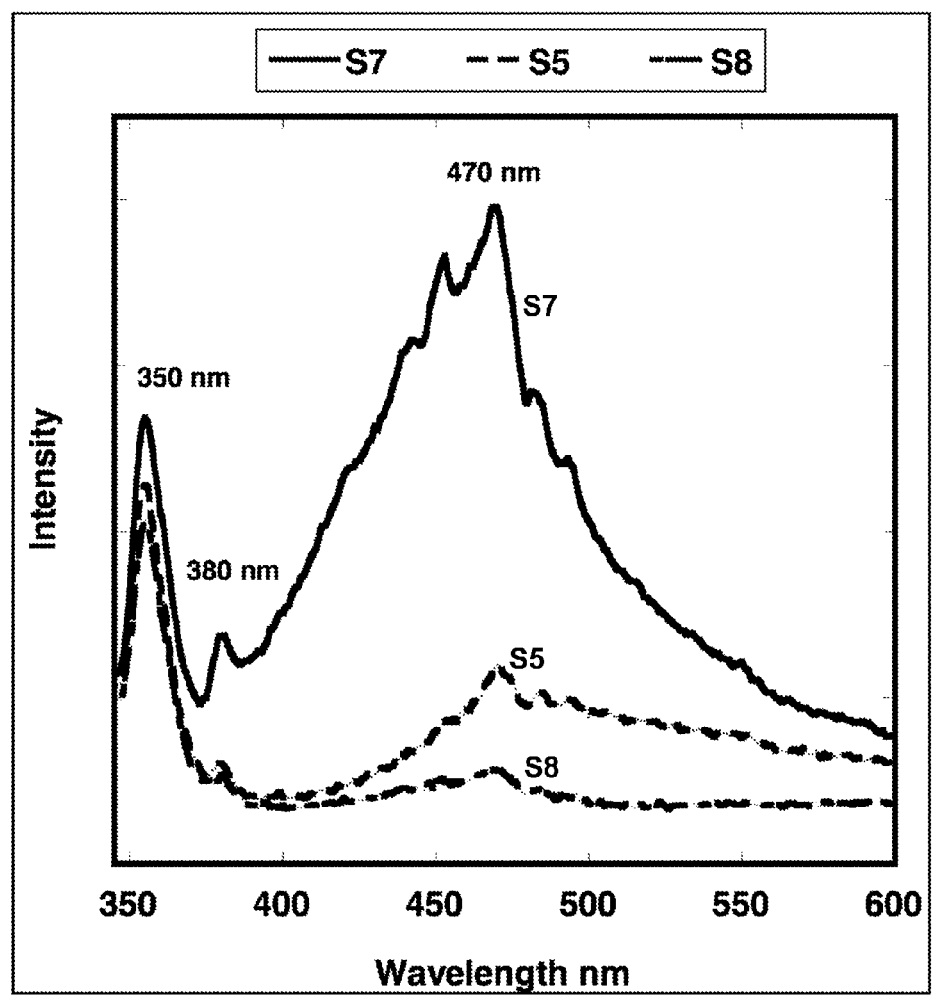
FIG. 22 show PL spectra of niobium oxynitride microcones (S5: annealed in ammonia at flow rate of 300 sccm for 1 hour and S7: annealed in ammonia at flow rate of 200 sccm for 7 hours) compared to niobium oxide microcone (S8: annealed in air for 20 minutes) according to the current invention.

For more optical characterization, the photoluminescence (PL) properties were measured at room temperature using excitation source of wavelength 325 nm. FIG. 22 shows the PL spectra of niobium oxynitride microcones annealed in ammonia at 300 sccm for one hour (S5) and that annealed at 200 sccm for seven hours (S7) compared to niobium oxide sample (S8). It is observed that the same peaks appear in the three samples at approximately 350, 380 and 470 nm. However, the intensity of the peaks is higher in the oxynitride samples in comparison with the oxide sample, especially for the peak at 470 nm. In addition, the oxynitride sample (S7) that has higher amount of nitrogen shows higher peak intensity than S3. Liu et al. showed the PL spectra at the same excitation wavelength for single-crystalline nanoporous $Nb_2O_5$ nanotubes. In contrast, the most prominent peak appeared at nearly 370 nm, while another small peak appeared at nearly 470 nm.

Both the absorption and the PL spectra revealed the enhanced optical properties of the oxynitride samples. In addition, the good optical properties depend on the amount of nitrogen doping, which is controlled by the annealing conditions.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, the average length of the oxynitride microcones increased from 13.8 to 22 µm. In addition, the tip size, at the top of the cone structure, increased from 2.5 for the oxide to 4 µm for the oxynitride. However, the aspect ratio of the microcone structures before and after annealing in ammonia remained approximately the same. Nitridation shifts the absorption edge from 450 nm for the oxide form to 777 nm for the oxynitride form. That can be turned into a variation in the bandgap from 2.8 to 1.56 eV. All such variations are considered to be within the scope and spirit of the present invention as defined by the following claims and their legal equivalents.

What is claimed:

1. A solar energy conversion structure comprising, a nitrogen doped niobium oxynitride microcone, wherein said nitrogen doped niobium oxynitride microcone comprises an absorption wavelength edge of 777 nm from an optical bandgap as low as 1.56 eV.

* * * * *